US012802831B2

(12) United States Patent
Hill

(10) Patent No.: US 12,802,831 B2
(45) Date of Patent: Nov. 17, 2026

(54) SHIELDED APPARATUS

(71) Applicant: MBDA UK LIMITED, Stevenage (GB)

(72) Inventor: Oliver Hill, Bristol (GB)

(73) Assignee: MBDA UK LIMITED, Stevenage (GB)

( * ) Notice: Subject to any disclaimer, the term of this patent is extended or adjusted under 35 U.S.C. 154(b) by 306 days.

(21) Appl. No.: 18/698,599

(22) PCT Filed: Oct. 6, 2022

(86) PCT No.: PCT/GB2022/052536
§ 371 (c)(1),
(2) Date: Apr. 4, 2024

(87) PCT Pub. No.: WO2023/057768
PCT Pub. Date: Apr. 13, 2023

(65) Prior Publication Data

US 2024/0420860 A1 Dec. 19, 2024

(30) Foreign Application Priority Data

Oct. 7, 2021 (GB) ...................................... 2114336

(51) Int. Cl.
*G21F 1/10* (2006.01)
*H05K 9/00* (2006.01)
*B33Y 80/00* (2015.01)

(52) U.S. Cl.
CPC ........... *G21F 1/106* (2013.01); *H05K 9/0026* (2013.01); *B33Y 80/00* (2014.12)

(58) Field of Classification Search
CPC ........ G21F 1/106; H05K 9/0026; B33Y 80/00
See application file for complete search history.

(56) References Cited

U.S. PATENT DOCUMENTS

| | | | |
|---|---|---|---|
| 2,970,217 | A | 1/1961 | Enikeieff |
| 3,024,640 | A | 3/1962 | Miller |
| 4,497,062 | A | 1/1985 | Mistretta et al. |

(Continued)

FOREIGN PATENT DOCUMENTS

| | | | |
|---|---|---|---|
| CN | 113466956 | A | 10/2021 |
| EP | 0224726 | A2 | 6/1987 |

(Continued)

OTHER PUBLICATIONS

GB Examination Report corresponding to Application No. 2114336.7, dated Nov. 1, 2024, 4 pages.

(Continued)

*Primary Examiner* — Nicole M Ippolito
(74) *Attorney, Agent, or Firm* — Day Pitney LLP; George Chaclas

(57) ABSTRACT

A shielded apparatus comprising a device and a shield, and a method of producing a shielded apparatus. The device attenuates x-rays by different amounts in different parts of the device, providing a first span of x-ray attenuations. The shield comprises a layer of x-ray attenuating material that attenuates x-rays by an amount that varies across the shield, providing a second span of attenuations. The second span of attenuations has a magnitude between 20% and 120% of the magnitude of the first span of attenuations.

19 Claims, 9 Drawing Sheets

(56) References Cited

U.S. PATENT DOCUMENTS

| | | | | |
|---|---|---|---|---|
| 4,659,602 | A | 4/1987 | Birch | |
| 2009/0224185 | A1 | 9/2009 | Workman et al. | |
| 2017/0309355 | A1 | 10/2017 | Lee et al. | |
| 2017/0365365 | A1 | 12/2017 | White et al. | |
| 2021/0210435 | A1* | 7/2021 | Tsai | H10W 42/20 |
| 2022/0082714 | A1* | 3/2022 | Ushikura | A61B 6/102 |

FOREIGN PATENT DOCUMENTS

| | | | |
|---|---|---|---|
| GB | 2463017 | A | 3/2010 |
| JP | 2003133202 | A2 | 5/2003 |
| WO | 2014184574 | A1 | 11/2014 |

OTHER PUBLICATIONS

International Preliminary Report on Patentability corresponding to Application No. PCT/GB2022/052536, dated Sep. 26, 2023, 16 pages.

GB Search Report corresponding to Application No. 2114336.7, dated Apr. 13, 2022, 10 pages.

International Search Report and Written Opinion corresponding to Application No. PCT/GB2022/052536, dated Dec. 7, 2022, 14 pages.

* cited by examiner

SHIELDED APPARATUS

CROSS-REFERENCE TO RELATED APPLICATIONS

The present application is a U.S. National Stage Application of International Application No. PCT/GB2022/052536 filed Oct. 6, 2022 and published on Apr. 13, 2023 as WO2023/057768 A1, which claims the benefit and priority of Great Britain Patent Application No. GB2114336.7 filed Oct. 7, 2021, each of which is incorporated herein by reference in their entirety for any purpose whatsoever.

TECHNICAL FIELD

The present disclosure relates to a shielded apparatus comprising a device and a shield comprising a layer of x-ray attenuating material. The present disclosure also relates to a method of producing a shielded apparatus.

BACKGROUND

Secure devices may require shielding so that they are not visible during use, deployment or transportation, and so that they cannot be detected or identified, at least not without evidence of detection or identification remaining. Shields may be used to block visible light, ensuring that devices cannot be seen during use, deployment and transportation. Such shields may be for temporary use, for example, during deployment or transportation, or may be permanently positioned to shield a device. Known shields are, for example, plates, boxes or containers. The type, size, and materials used for such shields is typically dependent upon the device that is to be shielded and the level of protection that is required. However, known shields may not provide protection against methods of detecting devices other than with visible light. For example, X-ray radiation can be used to detect, identify and image devices; conventional shields may not provide protection against X-ray radiation, and use of x-ray radiation will generally not leave any trace on the device or the shield, so it will not be apparent that X-rays have been used. Third parties may therefore be able to use x-rays to detect, identify and image a device without the knowledge of the legitimate handler of the device.

X-ray attenuating materials are known, and are used in various fields to entirely or partially attenuate x-ray radiation. In order to adequately block x-rays, heavy, large, and cumbersome shields are typically required. Shields which partially attenuate x-rays are used to provide some degree of protection for devices. Shields that introduce distracting patterns or messages into x-ray generated images are known. This may provide some degree of protection against detection and/or identification of devices; however, there are known techniques for compensating for such patterns/messages (such as simply subtracting the pattern or message from the x-ray image) and therefore this is not a robust and reliable method for shielding devices from x-rays.

Therefore there is a need to develop improved and more robust method of shielding devices from x-ray detection.

SUMMARY

The present disclosure provides, according to a first aspect, a shielded apparatus according to claim 1.

The present disclosure provides, according to a fifth aspect, a method of producing a shielded apparatus according to claim 19.

It will be appreciated that features described in relation to one aspect of the present disclosure may be incorporated into other aspects of the present disclosure. For example, the method of the disclosure may incorporate features described with reference to the apparatus of the disclosure and vice versa.

DESCRIPTION OF THE DRAWINGS

FIG. 3(*b*) is a schematic cross-sectional side view taken through a shielded apparatus using the shield of FIG. 3(*a*) according to an embodiment of the present disclosure;

DETAILED DESCRIPTION

Figure 1:
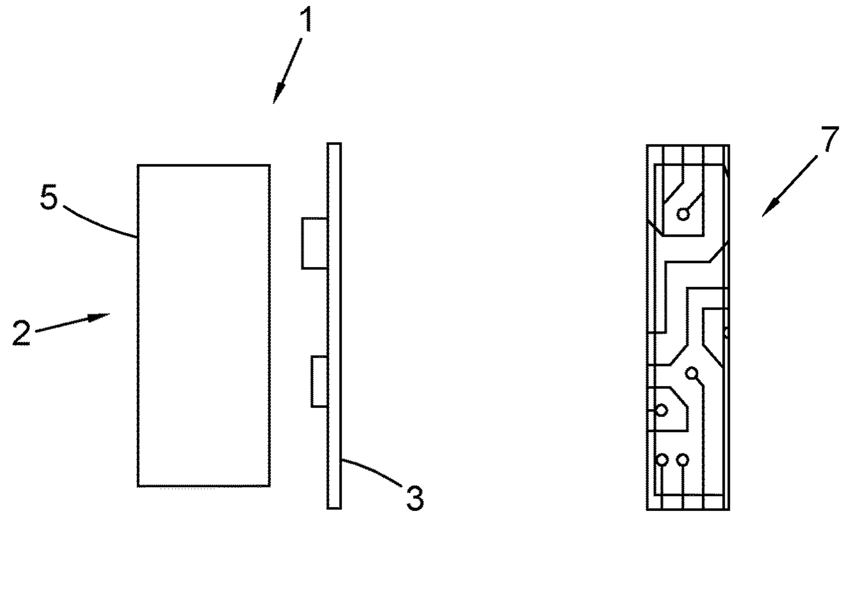
FIG. 1 (Prior Art)
FIG. 1 is a schematic side view of a shielded apparatus that is known in the art.

According to a first aspect, the present disclosure provides a shielded apparatus comprising a device. The device attenuates x-rays by different amounts in different parts of the device, providing a first span of x-ray attenuations. The apparatus comprises a shield. The shield comprises a layer of x-ray attenuating material that attenuates x-rays by an amount that varies across the shield, providing a second span of x-ray attenuations. The second span of attenuations has a magnitude of between 20% and 120% of the magnitude of the first span of attenuations.

The device may comprise electronic component, or a plurality of electronic components, such as a circuit board, and electronics board or a component of a circuit board. The device may comprise a plurality of copper components, silicon components and/or wires, which may have different attenuations. The device may be a mechanical device. The device may be a weapon, for example a missile. The device may be a component of a vehicle, such as engine. The device may be a computer. The device may be a laptop computer. The device may be a confidential prototype.

The device may comprise different materials having different x-ray attenuation coefficients and/or different thicknesses of material, giving rise to a first span of x-ray attenuations. The x-ray attenuation of the device will differ for different parts of the device, for example, because of the presence of surface features, or regions comprising a different material or a different thickness of a material. For example, the device may be a circuit board comprising a plurality of features. The features may give rise to a varying x-ray attenuation across the device.

Similarly, the x-ray attenuating layer may have a varying thickness and/or comprise different materials having different x-ray attenuation coefficients, giving rise to the second span of x-ray attenuations.

The second attenuation span has a magnitude of between 20% and 100% of the first attenuation span. If an attempt is made to image the device using x-rays, the layer of x-ray attenuating material causes additional attenuation of the x-rays that would be used to form an image.

The shield may be arranged relative to the device such that, if an attempt were made to image the device using x-rays, the shield would interrupt x-rays before they fall incident on the device and/or after they fall incident on the device. If an attempt is made to image the device using x-rays, the layer of x-ray attenuating material may introduce a pattern of noise into the image. This may lead to under-saturation of some parts of the image, and oversaturation of other parts of the image.

The second attenuation span may have a minimum attenuation that is within the first span of attenuations. The second attenuation span may have a minimum attenuation that is equal, or comparable to a maximum value of the first span of attenuations, such that the shield is more attenuating than the device being shielded. The second span of attenuations may have a minimum attenuation that is up to two times a maximum attenuation within the first span of attenuations. The shield may therefore be at least twice as attenuating as the device being shielded.

The layer of x-ray attenuating material may have a thickness that varies across the shield. A thickness variation across the shield may be dependent upon the device to be shielded, the expected energy of x-rays that may be used to attempt to image the device, and the material that is used to form the shield. For example, a shield for shielding an electronic circuit board may have an x-ray attenuating layer that has a thickness varying between 0.1 mm and 1 mm. A shield for shielding an engine component may have an x-ray attenuating layer that has a thickness varying between 0.1 mm and 400 mm. The variation in thickness across the shield may be a stepwise variation in thickness. The x-ray attenuating layer may comprise a plurality of pixels of x-ray attenuating material, with the pixels having different thicknesses.

The x-ray attenuation variation across the shield may be on a scale that is the same as, or comparable to, an x-ray attenuation variation across the device. Therefore if an attempt is made to image the device using x-rays, the shield may introduce a pattern of noise that obfuscates the image of the device.

The x-ray attenuation may vary randomly across the shield. Therefore if an attempt is made to image the device using x-rays, the shield may introduce a random pattern of noise into an image of the device. The attenuation of the x-ray attenuating material may vary randomly across all of the shield. Therefore if an attempt is made to image the device using x-rays, the shield may obfuscate an entire image of the device. The attenuation of the x-ray attenuating material may vary randomly across a portion of the shield. Therefore if an attempt is made to image the device using x-rays, the shield may obfuscate part of an image of the device. A portion of the shield may have a non-random variation in x-ray attenuation that would result in an encoded message being generated in an image formed by x-rays that have passed through the shield. The encoded message may be a text based message.

The choice of x-ray attenuating material/martials, and/or the thickness of x-ray attenuating material may depend upon the device that is being shielded, and/or on the likely range of x-ray energies that may be used to image the device. The thickness and/or choice of x-ray attenuating material used for the shield will be chosen such that the second attenuation span is between 20% and 120% of the first x-ray attenuation span.

The layer of x-ray attenuating material may comprise a continuous layer. The layer of x-ray attenuating material may be applied to a surface of the shield. The layer of x-ray attenuating material may partially or entirely cover a surface of the shield.

The layer of x-ray attenuating material may comprise a coating applied to a substrate. The shield may comprise a substrate, which may be a material that does not significantly attenuate x-rays. The substrate may be a resin or a binder.

The shield may comprise regions of x-ray attenuating material dispersed within a substrate material. The particles may be suspended within the substrate material. The substrate may be a solid or a liquid. The shield may further comprise an enclosed box for containing the substrate. The substrate may be a binder, for example, a resin. The substrate may comprise a material that does not significantly attenuate x-rays. The regions of x-ray attenuating material may be particles, for example, powder particles. The shield may therefore comprise a plurality of x-ray attenuating particles dispersed within a substrate. The regions of x-ray attenuating material may be 3D printed microstructures or shapes. The regions may be of the same size and shape, or may have different sizes and shapes and may therefore give rise to different levels of x-ray attenuation. Particles having different sizes and shapes may help to obscure different sized features of the device. The regions may comprise different materials. The regions may be copper particles or tungsten particles.

The shield may comprise a plurality of x-ray attenuating particles provided within a box. The particles may be free to move within the box. The particles may be free to move within the box in at least one direction. The particles may be free to move within the box in any direction. The particles may be able to rearrange relative to one another within the box. The particles may be of the same size and shape, or may have different sizes and shapes and may therefore give rise to different levels of x-ray attenuation. The particles may be particles of the same x-ray attenuating material, or a plurality of different-ray attenuating materials. The particles may comprise powder particles. The particles may comprise 3D printed microstructures or shapes. Particles having different sizes and shapes may help to obscure different sized features of the device. The shield may further comprise a supporting frame for positioning the box relative to the device.

The shield may comprise a combination of a plurality of x-ray attenuating regions or particles dispersed within a substrate, and a variation in thickness of x-ray attenuating material across the shield. The variation in thickness may be a stepwise variation in thickness arising from a plurality of pixels or pixel columns. The plurality of x-ray attenuating regions or particles dispersed within a solid substrate may be formed into columns of varying thickness, and these columns may be distributed across the shield.

The shield may be a panel, a plate or a box. The shield may be a briefcase, a safe, or a shipping container. The shield may be a planar panel or a curved panel. The shield may comprise a plurality of adjoining or connected panels. The shield may form part of a box, safe, briefcase or container, for example, the shield may be the lid of the container or box or may form part of the lid. The shield may be a box with a removable and/or resealable lid for removing and/or inserting the device.

The shield may be for temporary shielding of the device, for example, during transportation, deployment, or storage. The shield may be removably attached to a device or secured to a device. The shield may be a more permanent structure for protecting a device during its use or during storage. The shield may be positioned in front of the device, such that if an attempt were made to image the device using x-rays, the shield may interrupt x-rays before they reach the device. The shield may be positioned behind the device, such that if an attempt were made to image the device using x-rays, the shield may interrupt x-rays before they are used to form an image of the device. The shield may fully or partially surround the device. The shield may be in direct contact with the device. There may be an air gap between the shield and the device. Alternatively, there may be no air gap between the shield and the device. The shield may be welded or screwed to the device. The shield may be a plate that is comparable in size to the device, or slightly larger than the device.

The layer of x-ray attenuating material comprises a material selected from a list consisting of titanium, iron, nickel, copper, zinc, barium, tungsten, mercury, lead, bismuth and uranium. The thickness of the layer of x-ray attenuating material may be dependent upon the choice of material. For example, as uranium is more strongly x-ray attenuating than titanium, a thinner layer of uranium may be used to achieve the same attenuation as a thicker layer of titanium. The x-ray attenuating material may comprise a plurality of different materials. The material may be chosen dependent on the device that is to be shielded. The choice of material and the thickness of material may be dependent upon the likely range of x-ray energies that may be used in an attempt to image the device.

According to a second aspect the present disclosure provides a method of producing a shielded apparatus. The shielded apparatus comprises a device, wherein the device attenuates x-rays by different amounts in different parts of the device, providing a first span of x-ray attenuations. The apparatus comprises a shield. The shield comprises a layer of x-ray attenuating material that attenuates x-rays by an amount that varies across the shield, providing a second span of x-ray attenuations. The shielded apparatus may include any of the features set out above. The method comprises generating a variation in attenuation across the layer of x-ray attenuating material, wherein the second attenuation span has a magnitude between 20% and 120% of the magnitude of the first attenuation span. The method comprises applying the layer of x-ray attenuating material to the shield. The method comprises arranging the shield relative to the device such that if an attempt were made to image the device using x-rays the shield would intercept x-rays used to image the device.

If the shield is a box, a briefcase, a safe, or a container, arranging the shield relative to the device may comprise placing the device in the box, briefcase, safe or container. The method may comprise sealing the box, or container, or closing the briefcase or safe. Arranging the shield relative to the device may comprise fully or partially surrounding the device using the shield. Arranging the shield relative to the device may comprise positioning the shield in front of the device, such that if an attempt were made to image the device using x-rays, the shield would interrupt x-rays before they reach the device. Arranging the shield relative to the device may comprise positioning the shield behind the device. In this case, the shield may intercept x-rays after they have fallen incident on the device, but before an image is formed using the x-rays.

Applying the layer of x-ray attenuating material to the shield may comprise coating the layer onto a substrate or onto a surface of the shield. Applying the layer of x-ray attenuating material to the shield may comprise dispersing regions of the x-ray attenuating layer in a substrate. The method steps of generating a variation in attenuating, applying the layer to the shield, and arranging the shield relative to the device may be performed in any order. For example, the layer may be applied to the shield before the step of generating a variation in x-ray attenuation, or after generating a variation in x-ray attenuation.

Generating a variation in attenuation may comprise generating a variation in thickness across the layer of x-ray attenuating material. The variation in attenuation across the layer of x-ray attenuating material may be generated using additive layer manufacturing. This may be used to generate a continuous layer of x-ray attenuating material. The method may comprise applying this layer to a substrate which may form part of the shield. Using additive layer manufacturing may provide an efficient method of generate a fine scale variation of thickness. The variation in attenuation across the layer of x-ray attenuating material may be generated using CNC machining. The method may comprise using CNC machining to generate a random variation in thickness across the shield. The variation in attenuation across the layer of x-ray attenuating material may be generated using casting. Individual pixels may be cast and then assembled to form the layer of x-ray attenuating material. Alternatively, the layer of X-ray attenuating material may be cast as a whole. The manufacturing method may depend on the scale of the thickness variation that is required.

A prior art shielded apparatus 1 comprises (FIG. 1) a device 3 having a first span of x-ray attenuations and a shield 5 provided in front of the device 3. The shield 5 has a constant thickness and comprises a material that partially attenuates x-rays. The x-ray attenuation across the shield 5 will therefore be constant for x-rays of the same energy. If an attempt is made to form an image 7 of the device 3 using x-rays, the x-rays, x-rays that are directed towards the device 3 in the direction of arrow 2 will be interrupted by the shield 5 before they fall incident on the device 3. The shield 5 will partially attenuate the x-rays before they fall incident on the device 3. If an image 7 is formed using x-rays that have passed through the device 3 and the shield, the attenuation caused by the shield reduces the contrast of the image 7 in a uniform manner.

Figure 2:
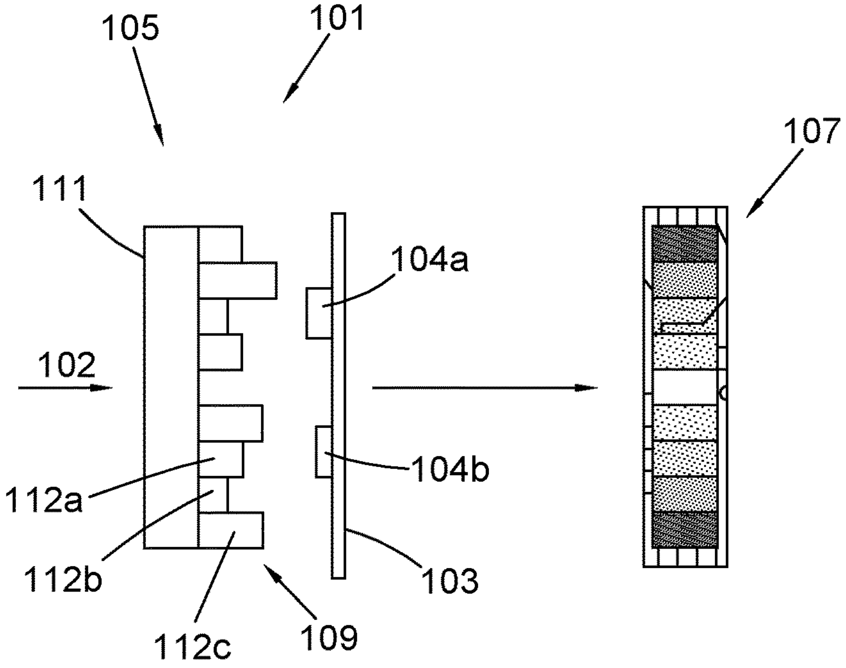
FIG. 2 is a schematic side view of a shielded apparatus according to an embodiment of the present disclosure.

A shielded apparatus 101 according to a first example embodiment of the present disclosure (FIG. 2) comprises a device 103 having a first span of x-ray attenuations and a shield 105. The shield 105 comprises a layer of x-ray attenuating material 109 that varies in attenuation across the shield 105 providing a second span of attenuation. The second span of attenuation has a magnitude between 20% and 120% of the magnitude of the first attenuation span. The first attenuation span is caused by a plurality of features 104*a*, 104*b* provided on the surface of the device 103. These features 104*a*, 104*b* are formed from a different material, having a different attenuation coefficient to the rest of the device, and locally increase the thickness of the device 103.

The layer of x-ray attenuating material 109 is disposed on a substrate 111 that forms part of the shield 105. The layer of x-ray attenuation material comprises a plurality of pixels, 112*a*, 112*b*, 112*c*, each pixel 112*a*, 112*b*, 112*c* having a different thickness. The x-ray attenuating material 109 has a constant x-ray attenuation coefficient but the different thicknesses across the layer 109 will give rise to a variation in attenuation across the layer 109.

The shield 105 is positioned in front of the device 103. If an attempt is made to form an image of the device using x-rays, the shield 105 will intercept x-rays that are directed towards device (for example, in the direction shown by arrow 102). The layer of x-ray attenuating material 109 will partially attenuate the x-rays, with thicker pixels (e.g. 112*c*) causing greater attenuation than thinner pixels (e.g. 112*b*). As the thickness variation across the layer is random, this will introduce a random pattern of noise into x-rays falling incident on the device 103. In turn, this introduces a random pattern of noise, or random contrast reduction, into an image 107 formed from the x-rays.

Using a variation in attenuation across the shield 105 to introduce a pattern of noise into an image formed from x-rays that have passed through the shield 105 enables effective obfuscating of an image using a thinner, and therefore lighter shield than known shields. Using a random variation in thickness across the shield 105 helps to prevent filtering of the image to eliminate the noise introduced by the shield 105.

Figure 3A:
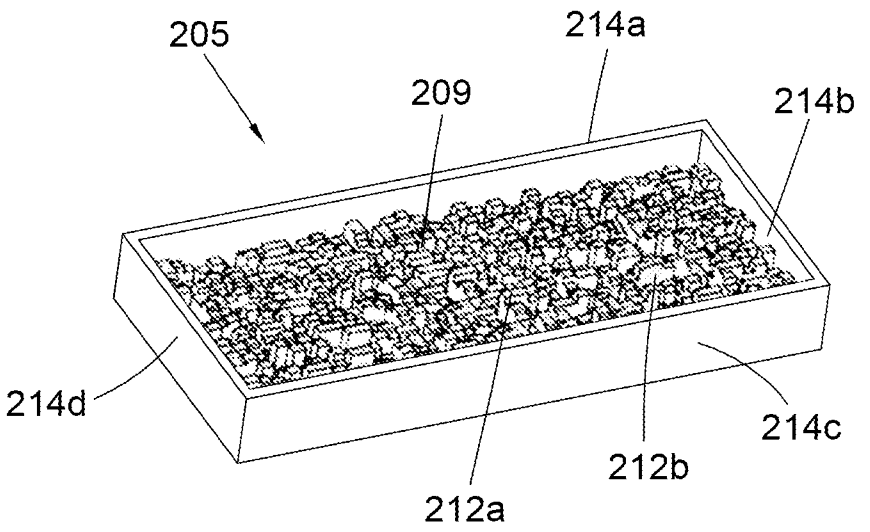
FIG. 3(*a*) is a perspective view of a shield for use in a shielded apparatus according to an embodiment of the present disclosure.
Figure 3B:
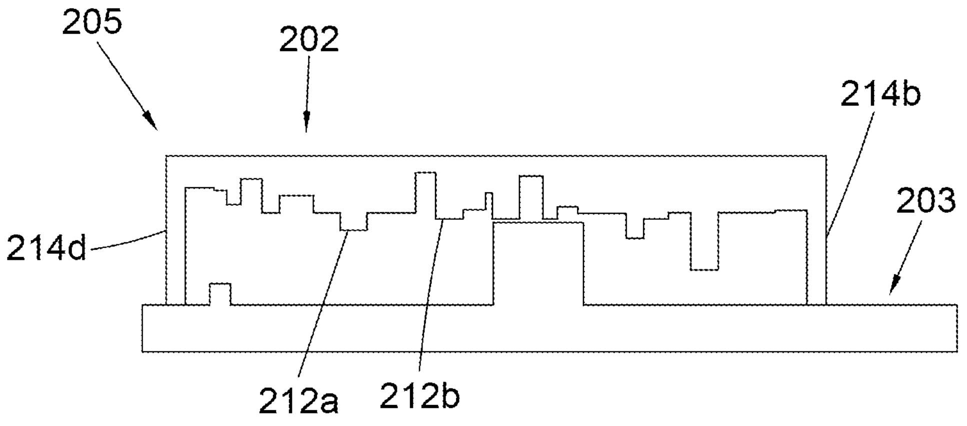

A shield 205 for use in a shielded apparatus 201 according to a second example embodiment of the present disclosure (FIG. 3(*a*)) comprises layer of x-ray attenuating material 209 that forms a plate, and side walls 214*a*, 214*b*, 214*c*, 214*d* extending in a perpendicular direction from the plate. The layer of x-ray attenuating material 209 comprises a plurality of pixels 212*a*, 212*b*, which have different thicknesses. The pixels 212*a*, 212*b* give rise to a variation in attenuation across the shield 205. The plate of the shield 205 has an area of 10 cm by 10 cm. Each pixel 212*a*, 212*b* is substantially cuboidal in shape. Each pixel 212*a*, 212*b* has an area in the plane of the plate of between 0.5 μm×0.5 μm and 1 mm×1 mm. Each pixel 212*a*, 212*b*, has a thickness (measured in a direction perpendicular to the plane of the plate) of between 0.1 mm and 1 mm. In use, the shield 205 is positioned in front of or on top of a circuit board 203, as shown in FIG. 3(*b*), and can be soldered to the circuit board 203. If an attempt is made to image the board using x-rays, the x-rays may have energies in the region of 40 keV to 100 keV may be used. If an image were to be generated using x-rays that have passed through the shield in a direction indicated by the arrow 202, a random pattern of noise would be introduced into the image as a result of the varying thickness of the pixels 212*a*, 212*b*.

In other embodiments (not shown), a shield may be screwed to an electronic circuit board or electronic component, or temporarily placed on top of or in front of an electronic circuit board or electronic component.

Figure 4:
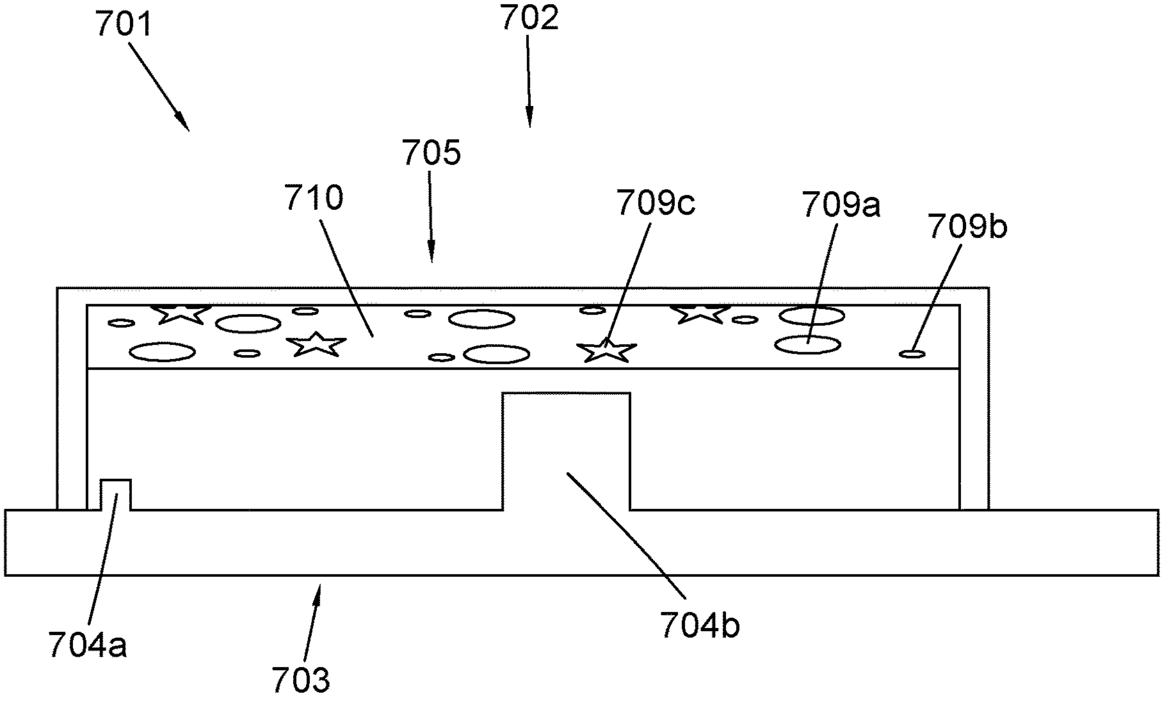
FIG. 4 is a schematic cross-sectional side view taken through a shielded apparatus according to an embodiment of the present disclosure, wherein the shield comprises a suspension of x-ray attenuating particles distributed within a substrate, and wherein there is an airgap between the substrate and the device.

A shielded apparatus 701 according to a second example embodiment of the present disclosure (FIG. 4) comprises a device 703 having a first span of x-ray attenuations and a shield 705. The shield 705 comprises plurality of x-ray attenuating copper particles 709*a*, 709*b*, 709*c*, suspended within a solid resin substrate 710. In other embodiments (not shown), the substrate may be a liquid substrate, and the substrate and particles may be enclosed within a container. The resin substrate 710 does not significantly attenuate x-rays. The x-ray attenuating particles 709*a*, 709*b*, 709*c* have different sizes and shapes with diameters ranging between 10 μm to 10 mm, and therefore will attenuate x-rays by different amounts. The shield thereby provides a second span of attenuations. The second span of attenuation has a magnitude between 20% and 120% of the magnitude of the first attenuation span. The first attenuation span is caused by a plurality of features 704*a*, 704*b* provided on the surface of the device 703. In this case, the device 703 is an electronics circuit board comprising a plurality of silicon components that are approximately 5 mm×5 mm in area. These features 704*a*, 704*b*, locally increase the thickness of the device 703.

The shield 705 is positioned on top of the device 703. If an attempt is made to form an image of the device 703 using x-rays, the shield 705 will intercept x-rays that are directed towards device (for example, in the direction shown by arrow 702). The x-ray attenuating particles 709*a*, 709*b*, 709*c* will partially attenuate the x-rays, with larger particles (e.g. 709*a*) causing greater attenuation than smaller particles (e.g. 709*b*). As the distribution of the particles 709*a*, 709*b*, 709*c*, is random, this will introduce a random pattern of noise into x-rays falling incident on the device 703. In turn, this introduces a random pattern of noise, or random contrast reduction, into an image formed from the x-rays.

Figure 5:
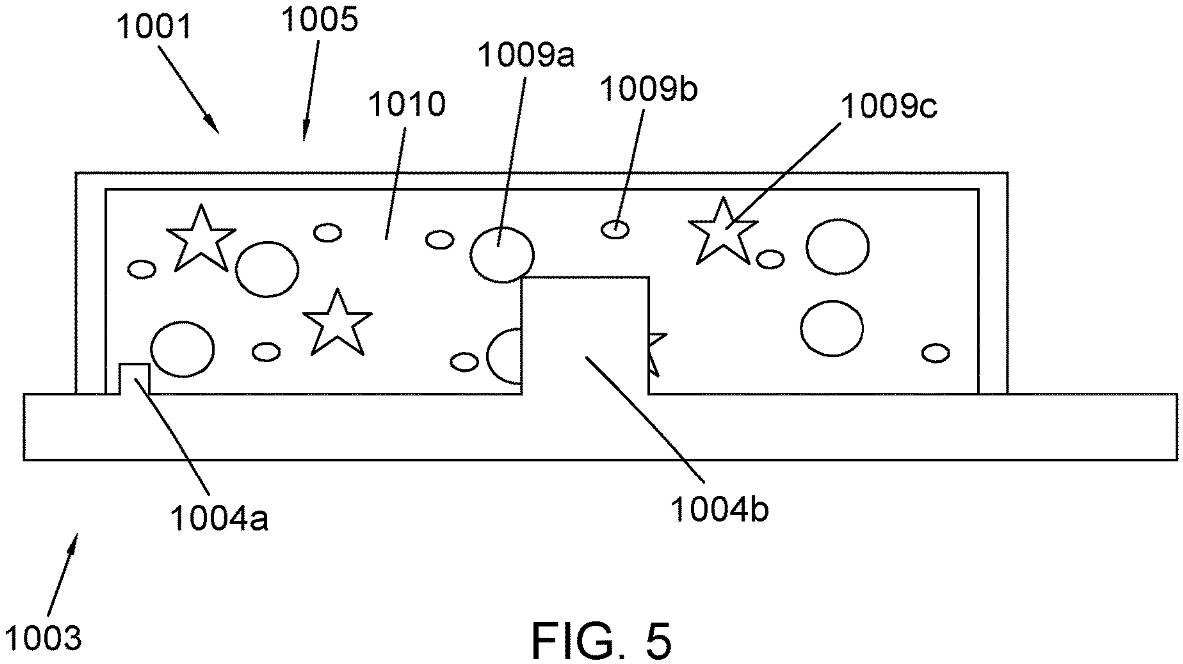
FIG. 5 is a schematic cross-sectional side view taken through a shielded apparatus according to an embodiment of the present disclosure, wherein the shield comprises a suspension of x-ray attenuating particles distributed within a substrate, and wherein there is no air gap between the substrate and the device.

A shielded apparatus 1001 according to a third example embodiment of the present disclosure (FIG. 5) comprises a device 1003 having a first span of x-ray attenuations and a shield 1005. The shield 1005 comprises plurality of x-ray attenuating copper particles 1009*a*, 1009*b*, 1009*c*, suspended within a solid substrate 1010. The substrate 1010 does not significantly attenuate x-rays. The x-ray attenuating particles 109*a*, 109*b*, 109*c* have different sizes and shapes, with diameters ranging between 10 μm and 10 mm, and therefore will attenuate x-rays by different amounts. The shield 1005 thereby provides a second span of attenuations. The second span of attenuation has a magnitude between 20% and 120% of the magnitude of the first attenuation span. The first attenuation span is caused by a plurality of features 1004*a*, 1004*b* provided on the surface of the device 1003. The device 1003 is an electronics board. These features 1004*a*, 1004*b*, locally increase the thickness of the device 1003.

The shield 1005 is positioned on top of and around the device 1003. In contrast to the shielded apparatus 701 shown in FIG. 4, there is no air gap between the shield 1005 and the device 1003. If an attempt is made to form an image of the device 1003 using x-rays, the shield 1005 will intercept x-rays that are directed towards device. The x-ray attenuating particles 1009*a*, 1009*b*, 1009*c* will partially attenuate the x-rays, with larger particles (e.g. 1009*a*) causing greater attenuation than smaller particles (e.g. 1009*b*). As the distribution of the particles 1009*a*, 1009*b*, 1009*c*, is random, this will introduce a random pattern of noise into x-rays falling incident on the device 1003. In turn, this introduces a random pattern of noise, or random contrast reduction, into an image formed from the x-rays.

A shielded apparatus 801 according to a third example embodiment of the present disclosure (FIG. 6) comprises a device 803 having a first span of x-ray attenuations and a shield 805. The shield 805 comprises plurality of x-ray attenuating copper particles 809*a*, 809*b*, 809*c*, contained within a box 810. The particles 809*a*, 809*b*, 809*c*, can move around relative to each other within the box 810. The x-ray attenuating particles 809*a*, 809*b*, 809*c* have different sizes with and shapes, with diameters ranging from between 10 μm and 10 mm, and therefore will attenuate x-rays by different amounts. The shield 805 thereby provides a second span of attenuations caused by the distribution of x-ray attenuating particles 809*a*, 809*b*, 809*c*, within the box 810. The distribution of x-ray attenuating particles 809*a*, 809*b*, 809*c* may change, for example, if the apparatus 801 is moved and therefore the variation in attenuation across the shield 805 may change if the apparatus 801 is moved. The second span of attenuation has a magnitude between 20% and 120% of the magnitude of the first attenuation span. The first attenuation span is caused by a plurality of features 804*a*, 804*b* provided on the surface of the device 803. These features 804*a*, 804*b*, locally increase the thickness of the device 803. The device 803 is an electronics circuit board.

The shield 805 is positioned on top of the device 805 and is suspended above the device by a supporting frame 811. If an attempt is made to form an image of the device 803 using x-rays, the shield 805 will intercept x-rays that are directed towards device. The x-ray attenuating particles 809*a*, 809*b*, 809*c* will partially attenuate the x-rays, with larger particles (e.g. 809*a*) causing greater attenuation than smaller particles (e.g. 909*b*). As the distribution of the particles 809*a*, 809*b*, 809*c*, is random, this will introduce a random pattern of noise into x-rays falling incident on the device 803. In turn, this introduces a random pattern of noise, or random contrast reduction, into an image 807 formed from the x-rays. If the apparatus 801 is moved, the arrangement of x-ray attenuating particles 809*a*, 809*b*, 809*c*, within the box 810 may change, and if a further attempt is made to image the device using x-rays, the shield 805 may introduce a different pattern of noise into x-rays falling incident on the device 803.

Figure 6:
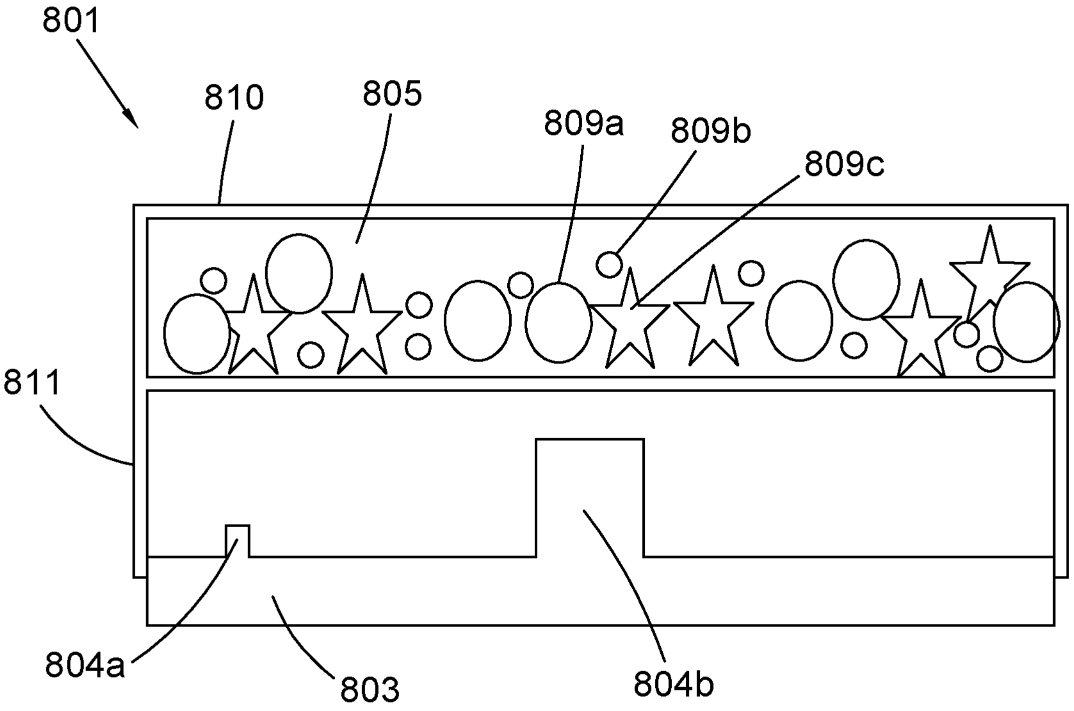
FIG. 6 is a schematic cross-sectional side taken through a shielded apparatus according to an embodiment of the present disclosure, wherein the shield comprises a suspension of x-ray attenuating particles in a box.

In the embodiment shown in FIG. 6, the x-ray attenuating copper particles 809*a*, 809*b*, 809*c* are contained in within a box 810 that is suspended above the electronics board. In other embodiments, the x-ray attenuating particles may not be contained within a separate box. The walls of the shield may enclose the device and the x-ray attenuating particles within the same space.

In other embodiments of the present disclosure (not shown), a shield may include x-ray attenuating particles of different materials, for example, copper and tungsten. Particles of x-ray attenuating material may be used in combination with a layer of x-ray attenuating material that forms a plate (such as that shown in FIGS. 3(*a*) and 3(*b*)).

Figure 7:
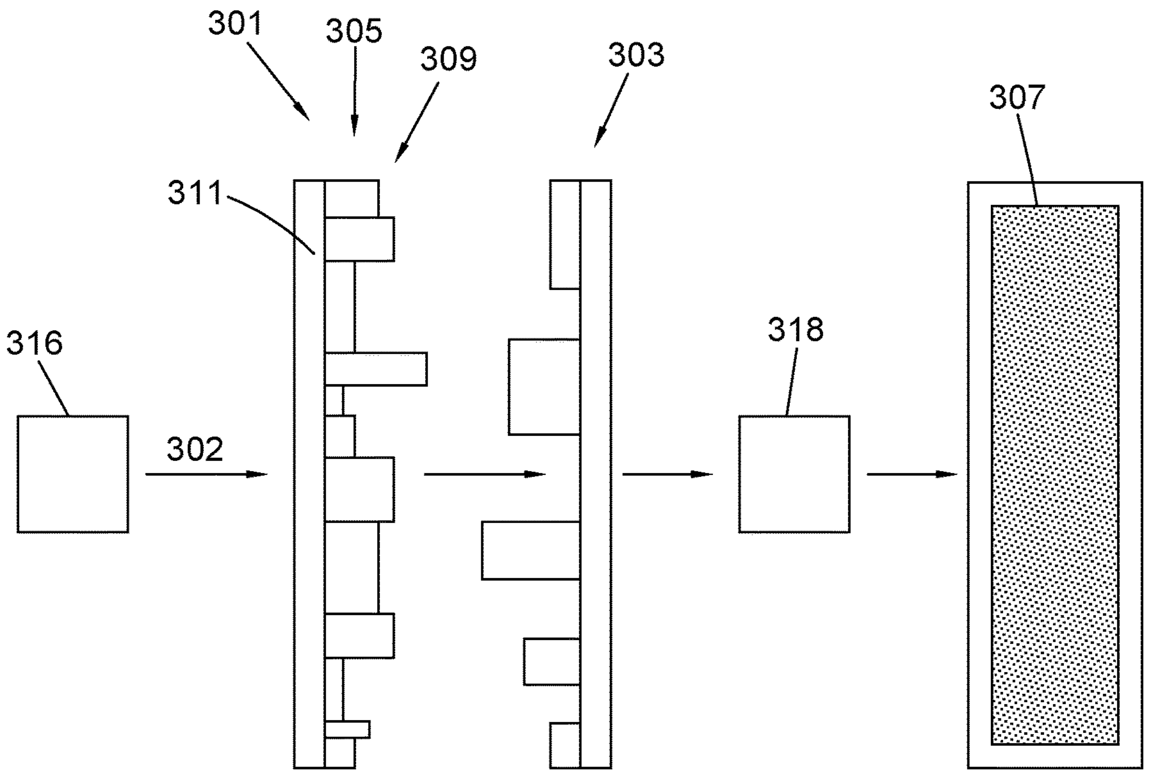
FIG. 7 is a schematic diagram showing the use of a shielded apparatus according to an embodiment of the present disclosure, when an attempt is made to image a device using x-rays.

A shielded apparatus 301 (FIG. 7) according to an embodiment of the present disclosure may be used in instances where it is expected that an attempt may be used to image a secure device 303 using x-rays. As shown in FIG. 7, x-rays may be transmitted from a transmitter 316 in the direction (shown by arrow 302) of the device 303. The shielded apparatus 301 comprises a shield 305, and x-rays from the transmitter 316 x-rays fall incident on the shield 305 before they reach the device 303. The shield 305 comprises a substrate and a layer of x-ray attenuating material 309. The layer of x-ray attenuating material 309 varies in thickness across the shield 305, and this gives rise to a variation in x-ray attenuation across the shield 305. The shield 305 therefore introduces a random pattern of noise into x-rays that fall incident on the shield 305. The shield will not fully attenuate x-rays and x-ray radiation with noise introduced by the shield 305 will therefore fall incident on the device 303. X-rays that have passed through both the shield 305 and the device 303 will be detected by a receiver 318, and an image 307 may be formed. As a result of the noise introduced into the x-rays by the shield 305, the image 307 of the device 303 will be obscured.

Figure 8:
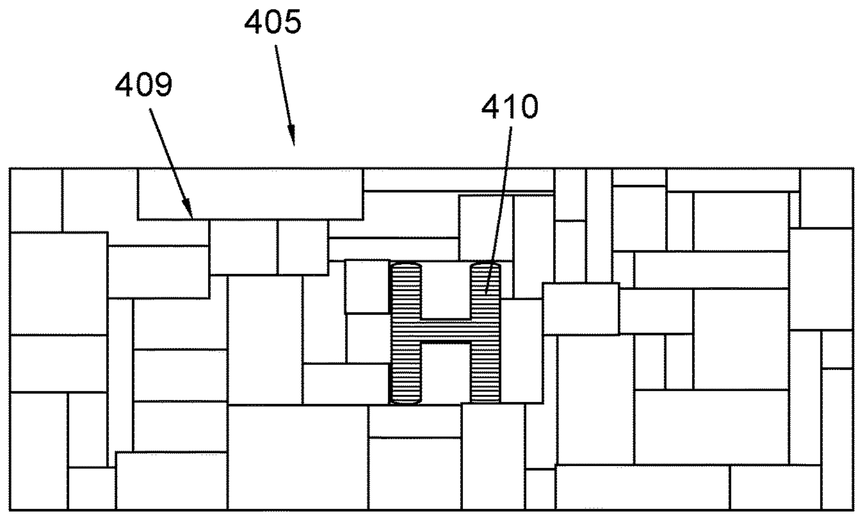
FIG. 8 is a top view of a shield for use in a shielded apparatus according to an embodiment of the present disclosure, wherein a portion of the shield has a non-random x-ray attenuation variation, according to an embodiment of the disclosure.

A shielded apparatus to an embodiment of the present disclosure (FIG. 8) may include a shield 405 that includes a portion having a non-random variation in thickness. If an attempt is made to image a device using x-rays, such a shield 405 may give rise to an encoded message in the image. The shield 405 comprises a layer of x-ray attenuating material 409. A portion of the x-ray attenuating layer 409 has a thickness that varies randomly across the shield 405. A portion of the x-ray attenuating material 409 has a non-random variation in thickness, which forms a character 410. If x-ray radiation falls incident on the shield 405 and the radiation is later used to form an image, an encoded message may be introduced into the image.

Figure 9:
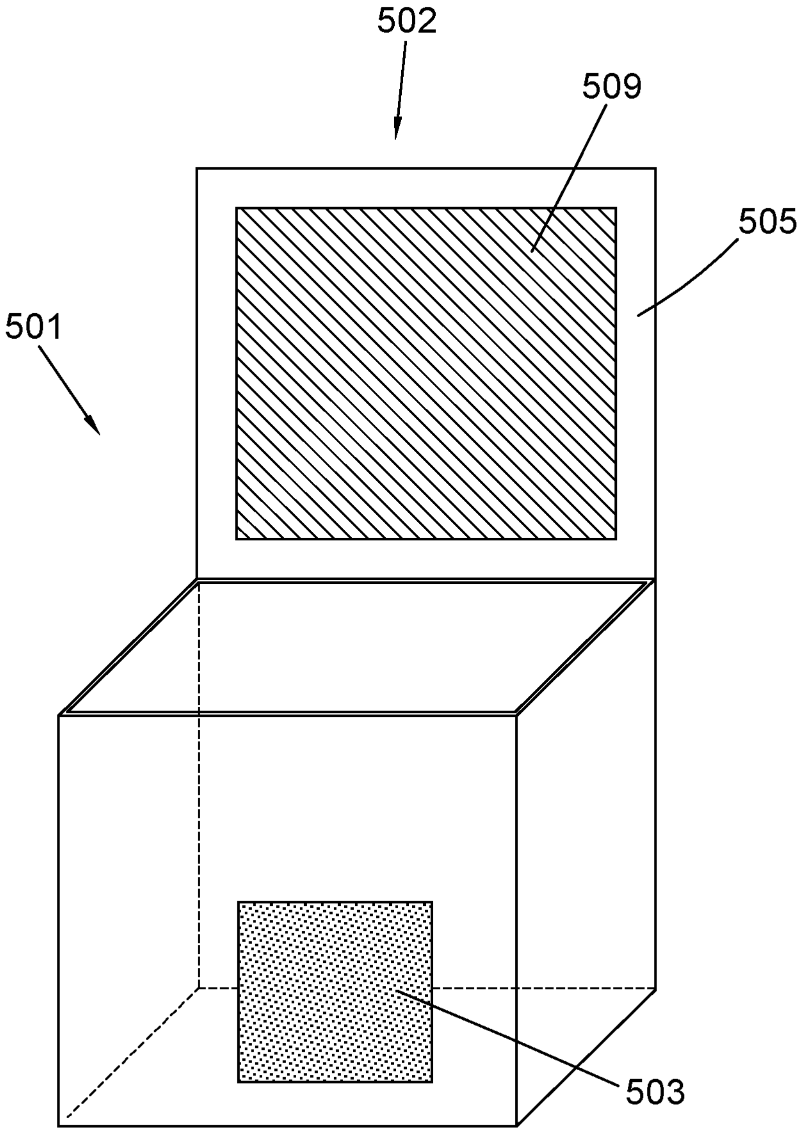
FIG. 9 is a shielded apparatus according to an embodiment of the present disclosure, wherein the shield forms the lid of a box.

According to an embodiment of the present disclosure (FIG. 9), the shielded apparatus 501 comprises a shield 505 which forms the lid of a box and a device 503 placed within the box. The shield 505 comprises a layer of x-ray attenuating material 509. If an attempt is made to image the device using x-rays directed towards the device in a direction indicated by the arrow 502, the shield will introduce a pattern of noise into x-rays, and this will obfuscate the resulting image.

Figure 10:
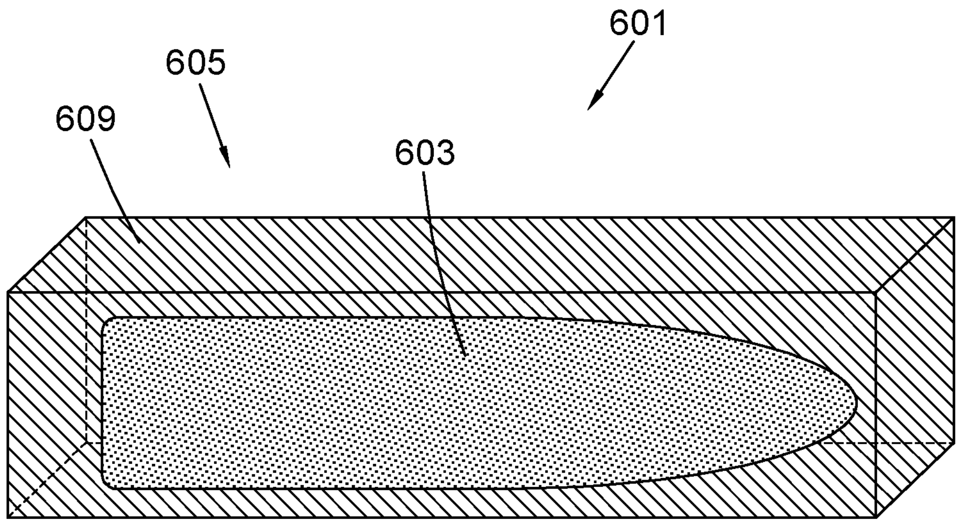
FIG. 10 is a shielded apparatus according to an embodiment of the present disclosure wherein the shield is a box and the device is a missile, and wherein the box has a layer of x-ray attenuating material applied to each wall.

According to an embodiment of the present disclosure (FIG. 10), the shielded apparatus 601 includes a shield 605 in the form of a box. The box 605 surrounds a missile 603. A layer of x-ray attenuating material 609 is applied to each surface of the box 605. If x-rays fall incident on the box 605 from any angle, the x-ray attenuating material 609 will introduce a pattern of noise into the x-rays.

Figure 11:
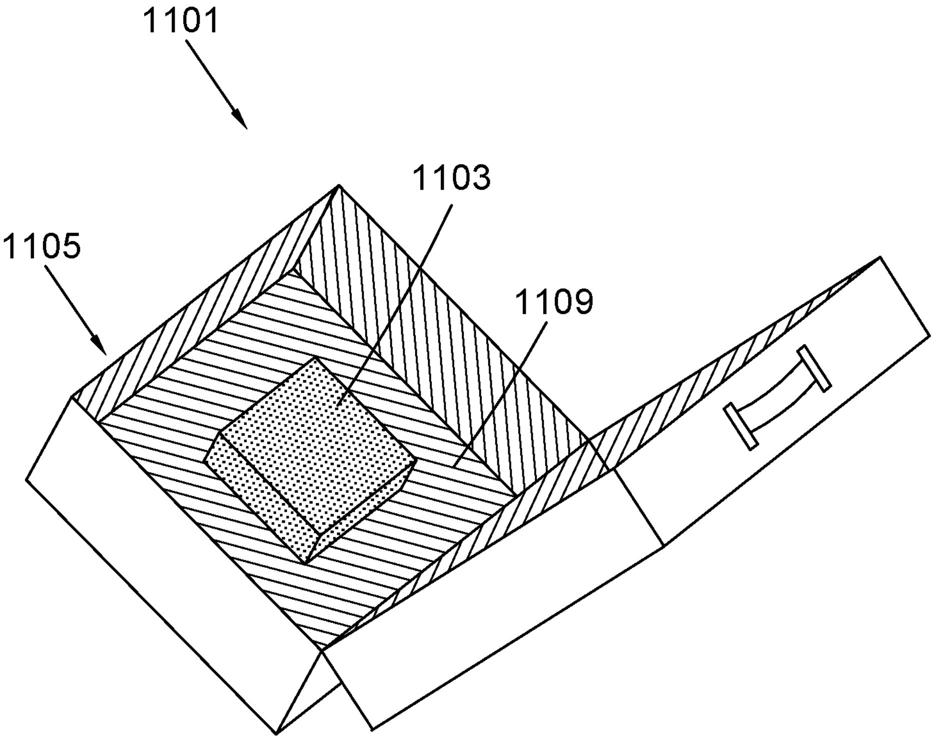
FIG. 11 is a shielded apparatus according to an embodiment of the present disclosure wherein the shield is a briefcase and the device is a confidential prototype, and wherein the briefcase has a layer of x-ray attenuating material contained within its lining.

According to an example embodiment of the present disclosure (FIG. 11) the shielded apparatus 1101 includes a shield 1105 in the form of a briefcase. The briefcase 1105 houses a device 1103 in the form of a confidential prototype. The prototype includes iron features having dimensions of between 0.1 mm and 30 mm. An x-ray attenuating layer 1109 is contained within the lining of the briefcase 1105. The x-ray attenuating layer 1109 comprises a plurality of particles (not shown) of x-ray attenuating particles having dimensions of between 0.005 mm and 5 mm. The particles are particles of different materials. Some particles are tungsten, some are lead, some are polymers, and some are ceramics. The particles are suspended within a barium filled resin binder. The resin binder does not significantly attenuate x-rays. The resin binder and suspended particles are arranged to form pixel columns within the lining of the briefcase 1105. The pixel columns have widths of between 5 mm and 50 mm and heights between 5 mm and 30 mm. If x-rays fall incident on the briefcase 1105 from any angle, the x-ray attenuating material within the briefcase 1105 lining will introduce a pattern of noise into the x-rays.

X-rays falling incident on the briefcase 1105 may have energies in the region of 40 keV to 300 keV.

In other embodiments (not shown), an x-ray attenuating layer may be contained within a dedicated are of a briefcase, rather than within a lining.

Figure 12:
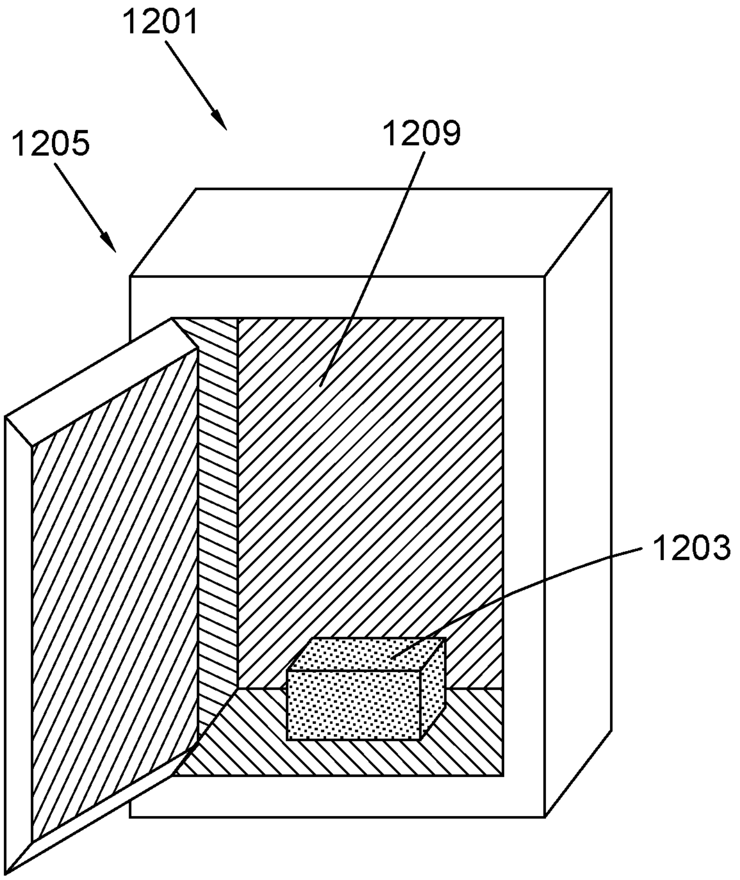
FIG. 12 is a shielded apparatus according to an embodiment of the present disclosure wherein the shield is a safe and the device is a laptop, and wherein the briefcase has a layer of x-ray attenuating material within its lining.

According to an example embodiment of the present disclosure (FIG. 12) the shielded apparatus 1201 includes a shield 1205 in the form of a safe. A device 1203 in the form of a laptop is housed within the safe 1205. The safe 1205 has an internal volume of 30 cm in height, 40 cm in depth and 40 cm wide. The safe 1205 is designed to shield the laptop 1203 from x-rays having energies of between about 400 and 400 keV. The laptop 1203 includes features that give rise to a first span of attenuations. The features have dimensions of about 0.05 to 50 mm, and have similar attenuations to 10 mm of copper. The safe 1205 includes a layer 1209 of x-ray attenuating material in the form of a plurality of copper pixel columns distributed across a surface of the safe. The columns have heights ranging from 0 mm to 20 mm. If x-rays fall incident on the safe 1205, copper pixels will introduce a pattern of noise into the x-rays.

In another example embodiment (not shown), in addition to, or in place of the copper pixels, a surface of the safe includes particles of x-ray attenuating material suspended in a substrate, or particles of an x-ray attenuating material provided within a box, in order to provide additional shielding.

According to an example embodiment of the present disclosure (not shown), the shielded apparatus is a shipping container housing a vehicle with an engine. The shield is a secure panel forming part of the container. The device to be shielded is an engine of the vehicle. The engine includes features having geometries of between 5 and 50 mm. The engine has a similar attenuation to 200 mm of iron. If an attempt is made to image a shipping container using x-rays, x-ray energies of between 40 keV to 8 MeV may be used. The secure panel comprises a layer of x-ray attenuating material, which comprises a plurality of column pixels. The column pixels have range in height from 2.5 mm to 100 mm, and the column pixels comprise iron. The top surface of each of the column pixels is textured to give rise to additional x-ray attenuation. The pixel height variation varies randomly across the secure panel.

In another example embodiment (not shown) the shielded apparatus is a shipping container, and the shield is a secure panel forming part of the container. The secure panel includes a plurality of x-ray attenuating particles. The particles are iron particles having a diameter of between 2.5 mm and 10 mm. The particles have varying cross-sections and, shapes and sizes. If an attempt is made to image the contents of the container using x-rays and x-rays fall incident on the secure panel, the particles will introduce a pattern of noise into the x-rays.

According to an example embodiment of the present disclosure (not shown), the shielded apparatus comprises a device in the form of an electronic circuit board. The circuit board includes plurality of electronic components, for example, silicon components that have a width of around 5 mm and traces that have a width of about 20 μm. The circuit board comprises a layer of copper having a thickness of 0.5 mm. The shield comprises a panel that includes a layer of x-ray attenuating material. The layer comprises a plurality of pixel columns. The pixel columns have a thickness ranging from 0.1 to 1 mm and are square in cross-sectional shape. The panel is screwed onto the top of the circuit board. The panel shields the circuit board from x-rays having an energy of between 40 keV and 100 keV.

According to an embodiment of the present disclosure (not shown), the shielded apparatus comprises a shield including both a plurality of x-ray attenuating particles suspended in a substrate, giving rise to a variation in x-ray attenuation across the shield, and additionally, including plurality of pixelated columns of x-ray attenuating material of varying thickness, giving rise to additional variation in x-ray attenuation across the shield. Such a shield may be used to shield an electronic circuit board. The pixelated columns may be used to shield silicon components of the circuit, and particles of x-ray attenuating material suspended in a substrate may be used to shield circuit wires.

According to an embodiment of the present disclosure (not shown), the shielded apparatus comprises a stack of circuit boards (devices), stacked on top of one another within a shield case. The case has dimensions of approximately 50 cm×50 cm in area, and 20 cm in depth.

Figure 13:
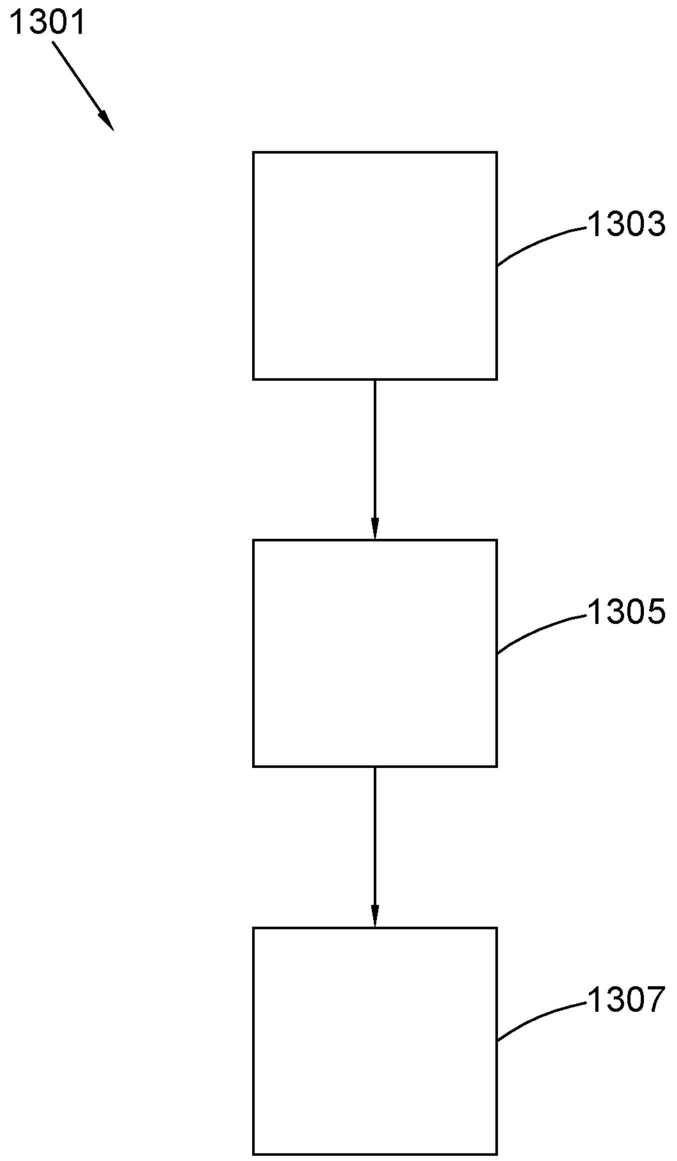
FIG. 13 is a flowchart showing a method of producing a shielded apparatus, according to an embodiment of the present disclosure.

An embodiment of the present disclosure (FIG. 13) provides a method 1301 of producing a shielded apparatus. The shielded apparatus comprises a device, wherein the device attenuates x-rays by different amounts in different parts of the device, providing a first span of attenuates, and a shield. The shield comprises a layer of x-ray attenuating material that attenuates x-rays by an amount that varies across the shield providing a second span of x-ray attenuations. In a first step 1303, the method comprises generating a variation in attenuation across the layer of x-ray attenuating material, such that the second attenuation span has a magnitude between 20% and 120% of the first attenuation span. In a second step 1305, the method comprises applying the layer of x-ray attenuating material to the shield. In a third step 1307, the method comprises arranging the shield relative to the device such that if an attempt were made to image the device using x-rays the shield would intercept x-rays used to image the device.

Whilst the present disclosure has been described and illustrated with reference to particular embodiments, it will be appreciated by those of ordinary skill in the art that the present disclosure lends itself to many different variations not specifically illustrated herein. Wherein in the foregoing description integers or elements are mentioned which have known, obvious or reasonably foreseeable equivalents, then such equivalents are herein incorporated as if individually set forth. Reference should be made to the claims for determining the true scope of the present disclosure, which should be construed so as to encompass any such equivalents. It will also be appreciated by the reader that integers or features of the present disclosure that are described as preferable, advantageous, convenient or the like are optional and do not limited the scope of the independent claims. Moreover, it is to be understood that such optional integers and features, whilst of possible benefit in some embodiments of the present disclosure, may not be desirable, and may therefore be absent, in other embodiments.

The invention claimed is:

1. A shielded apparatus comprising:

a device, wherein the device attenuates x-rays by different amounts in different parts of the device, providing a first span of x-ray attenuations, and a shield, wherein the shield comprises a layer of x-ray attenuating material that attenuates x-rays by an amount that varies across the shield, providing a second span of attenuations, and wherein the second span of attenuations has a magnitude between 20% and 120% of a magnitude of the first span of attenuations; and wherein the layer of x-ray attenuating material has a thickness that varies across the shield such that the x-ray attenuation varies randomly across the shield.

2. The shielded apparatus according to claim 1, wherein the second span of attenuations has a minimum attenuation that is within the first span of attenuations.

3. The shielded apparatus according to claim 1, wherein the second span of attenuations has a minimum attenuation that is up to two times a maximum attenuation within the first span of attenuations.

4. The shielded apparatus according to claim 1, wherein the attenuation variation across the shield is on the same scale, or a comparable scale to an attenuation variation across the device.

5. The shielded apparatus according to claim 1, wherein the attenuation of the x-ray attenuating material varies randomly across all of the shield.

6. The shielded apparatus according to claim 1, wherein the attenuation of the x-ray attenuating material varies randomly across a portion of the shield.

7. The shielded apparatus according to claim 6, wherein a portion of the shield has a non-random x-ray attenuation variation that would result in an encoded message being generated in an image formed by x-rays that have passed through the shield.

8. The shielded apparatus according to claim 1, wherein the variation in thickness of the x-ray attenuating material is a stepwise variation in thickness.

9. The shielded apparatus according to claim 1, wherein the layer of x-ray attenuating material comprises a continuous layer.

10. The shielded apparatus according to claim 1, wherein the layer of x-ray attenuating material comprises a coating applied to a substrate.

11. The shielded apparatus according to claim 1, wherein the shield comprises regions of x-ray attenuating material dispersed within a substrate material.

12. The shielded apparatus according to claim 11, wherein the shield comprises a plurality of x-ray attenuating particles dispersed within a substrate material.

13. The shielded apparatus according to claim 1, wherein the shield comprises a plurality of x-ray attenuating particles provided within a box.

14. The shielded apparatus according to claim 1, wherein the shield comprises a panel.

15. The shielded apparatus according to claim 1, wherein the shield comprises a box, a briefcase, a safe, or a container.

16. The shielded apparatus according to claim 1, wherein the layer of x-ray attenuating material comprises a material selected from a list consisting of titanium, iron, nickel, copper, zinc, barium, tungsten, mercury, lead, bismuth, and uranium.

17. A method of producing a shielded apparatus, the shielded apparatus comprising a device, wherein the device attenuates x-rays by different amounts in different parts of the device, providing a first span of x-ray attenuations, and a shield, wherein the shield comprises a layer of x-ray attenuating material that attenuates x-rays by an amount that varies across the shield, providing a second span of x-ray attenuations, wherein the method comprises:

generating a random variation in attenuation across the layer of x-ray attenuating material, such that the second span of x-ray attenuations has a magnitude between 20% and 120% of the magnitude of the first span of x-ray attenuations; applying the layer of x-ray attenuating material to the shield; and arranging the shield relative to the device such that if an attempt were made to image the device using x-rays the shield would intercept x-rays used to image the device and wherein generating the variation in attenuation comprises generating a variation in thickness across the layer of x-ray attenuating material.

18. The method according to claim 17, wherein the variation in attenuation across the layer of x-ray attenuating material is generated using additive layer manufacturing.

19. The method according to claim 17, wherein the variation in attenuation across the layer of x-ray attenuating material is generated using CNC machining.

* * * * *